US009735018B2

(12) United States Patent
Chen et al.

(10) Patent No.: US 9,735,018 B2
(45) Date of Patent: *Aug. 15, 2017

(54) EXTREMELY THIN PACKAGE

(71) Applicant: Silego Technology, Inc., Santa Clara, CA (US)

(72) Inventors: Chia Chuan Chen, Hsinchu County (TW); Lung-Pao Chin, Kaohsiung (TW); I-Kuo Lin, Hsinchu (TW)

(73) Assignee: Silego Technology, Inc., Santa Clara, CA (US)

( * ) Notice: Subject to any disclaimer, the term of this patent is extended or adjusted under 35 U.S.C. 154(b) by 6 days.

This patent is subject to a terminal disclaimer.

(21) Appl. No.: 14/834,333

(22) Filed: Aug. 24, 2015

(65) Prior Publication Data

US 2015/0364331 A1    Dec. 17, 2015

Related U.S. Application Data

(63) Continuation of application No. 14/032,696, filed on Sep. 20, 2013, now Pat. No. 9,147,629.
(Continued)

(51) Int. Cl.
*H01L 21/304* (2006.01)
*H01L 23/29* (2006.01)
(Continued)

(52) U.S. Cl.
CPC .......... *H01L 21/304* (2013.01); *H01L 21/561* (2013.01); *H01L 21/6836* (2013.01); *H01L 23/293* (2013.01); *H01L 23/3142* (2013.01); *H01L 23/49548* (2013.01); *H01L 23/544* (2013.01); *H01L 24/97* (2013.01); *H01L 21/568* (2013.01); *H01L 23/3107* (2013.01);
(Continued)

(58) Field of Classification Search
CPC ... H01L 21/56; H01L 23/3114; H01L 21/304; H01L 21/561; H01L 23/49548; H01L 24/97; H01L 23/293; H01L 23/544; H01L 23/3142; H01L 21/6836; H01L 23/29; H01L 23/00; H01L 23/495; H01L 2221/68327; H01L 2221/6834; H01L 2223/54433; H01L 2223/54486; H01L 23/3107; H01L 21/568; H01L 2224/16245; H01L 2924/181; H01L 2924/00

See application file for complete search history.

(56) References Cited

U.S. PATENT DOCUMENTS

| 6,750,082 B2 * | 6/2004 | Briar | H01L 23/3107 257/E23.101 |
| 6,870,248 B1 | 3/2005 | Shibata | |
| 9,147,629 B2 * | 9/2015 | Chen | H01L 23/544 |

FOREIGN PATENT DOCUMENTS

| CN | 101471317 A | 7/2009 |
| JP | 2001007238 A | 1/2001 |

(Continued)

*Primary Examiner* — Roy Potter
(74) *Attorney, Agent, or Firm* — Van Pelt, Yi & James LLP

(57) ABSTRACT

Techniques for achieving extremely thin package structures are disclosed. In some embodiments, a device comprises an integrated circuit connected to a leadframe or substrate via connections and EMC (Epoxy Molding Compound) surrounding the integrated circuit except at a backside of the integrated circuit and connecting areas via which the integrated circuit is connected to the leadframe or substrate.

21 Claims, 17 Drawing Sheets

Related U.S. Application Data

(60) Provisional application No. 61/703,708, filed on Sep. 20, 2012.

(51) Int. Cl.
*H01L 23/31* (2006.01)
*H01L 21/56* (2006.01)
*H01L 23/495* (2006.01)
*H01L 23/00* (2006.01)
*H01L 23/544* (2006.01)
*H01L 21/683* (2006.01)

(52) U.S. Cl.
CPC ............... *H01L 2221/6834* (2013.01); *H01L 2221/68327* (2013.01); *H01L 2223/54433* (2013.01); *H01L 2223/54486* (2013.01); *H01L 2224/16245* (2013.01); *H01L 2924/181* (2013.01)

(56) References Cited

FOREIGN PATENT DOCUMENTS

| | | |
|---|---|---|
| JP | 2001057404 A | 2/2001 |
| JP | 2001068585 A | 3/2001 |
| JP | 2001332654 A | 11/2001 |
| JP | 2004158739 A | 6/2004 |
| JP | 2006279088 A | 10/2006 |
| JP | 2007126622 | 5/2007 |

\* cited by examiner

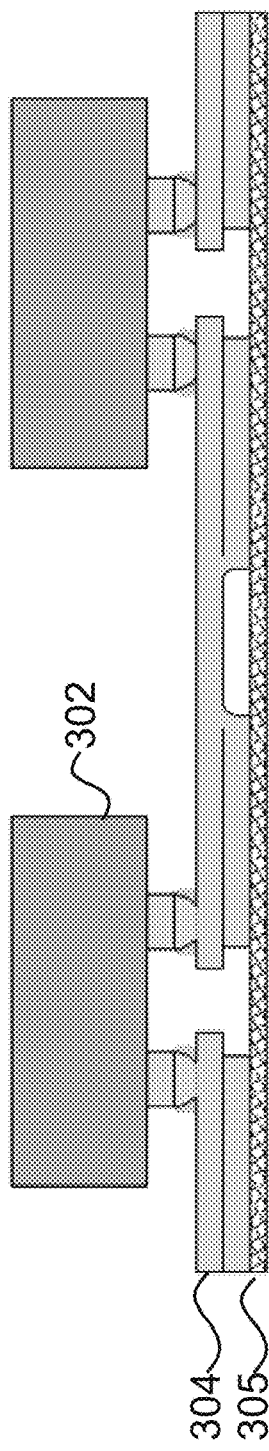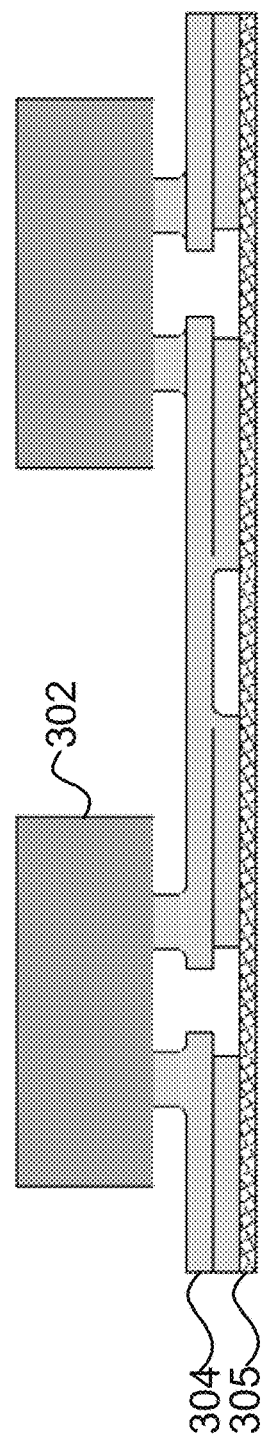
FIG. 3B
FIG. 3C

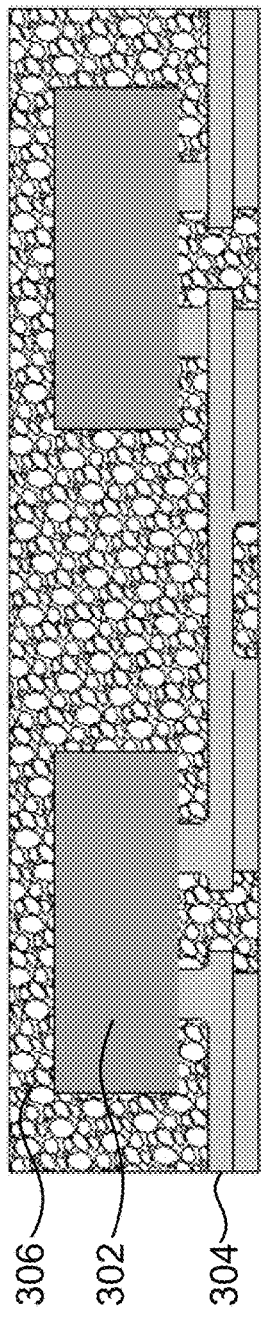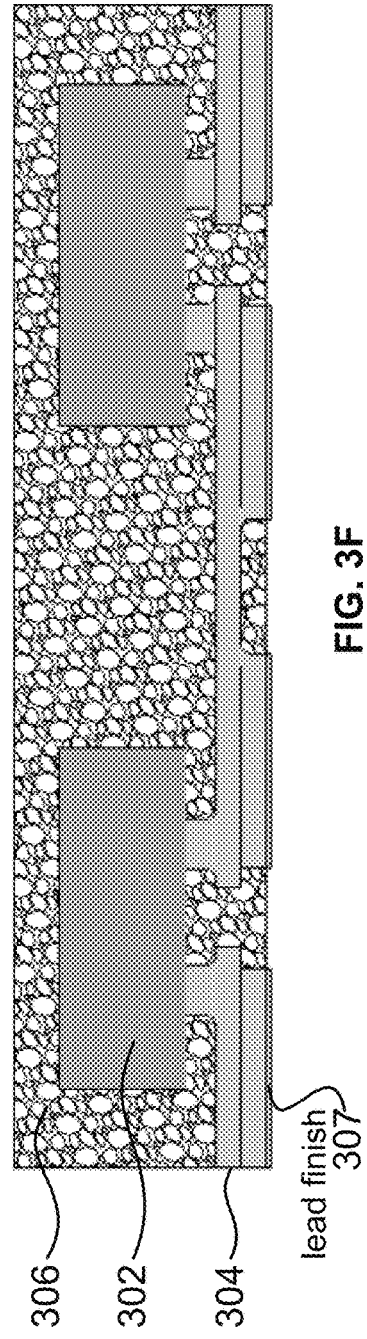

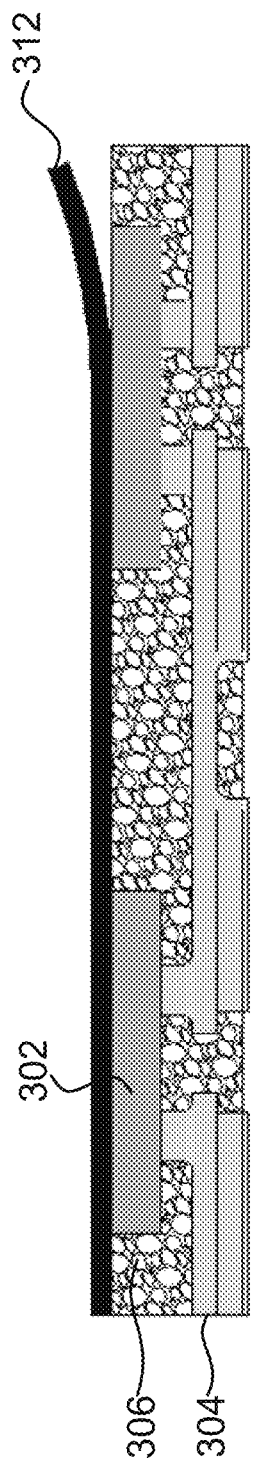
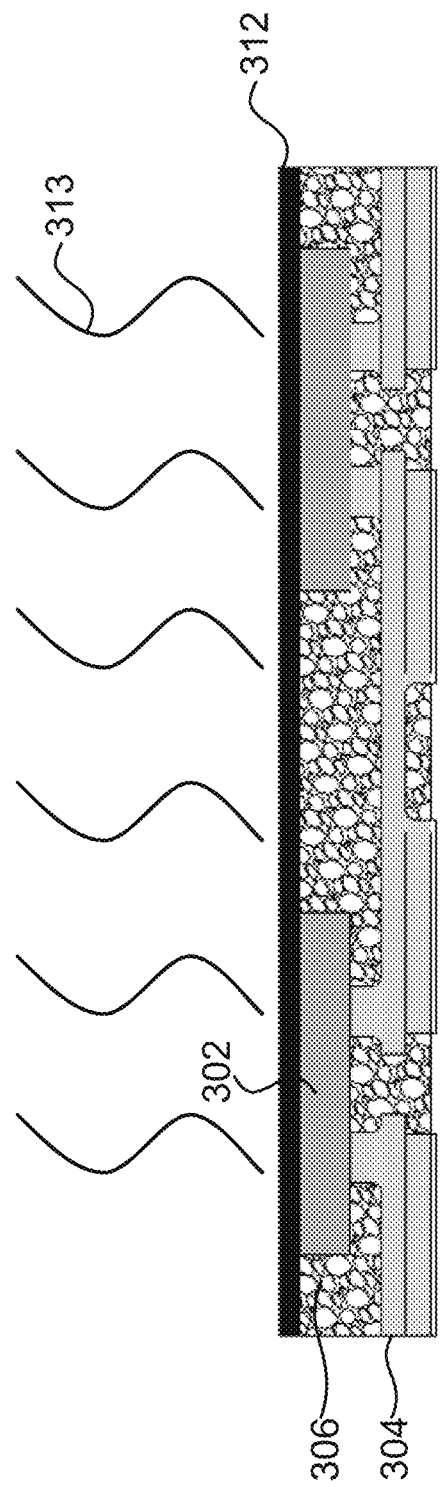

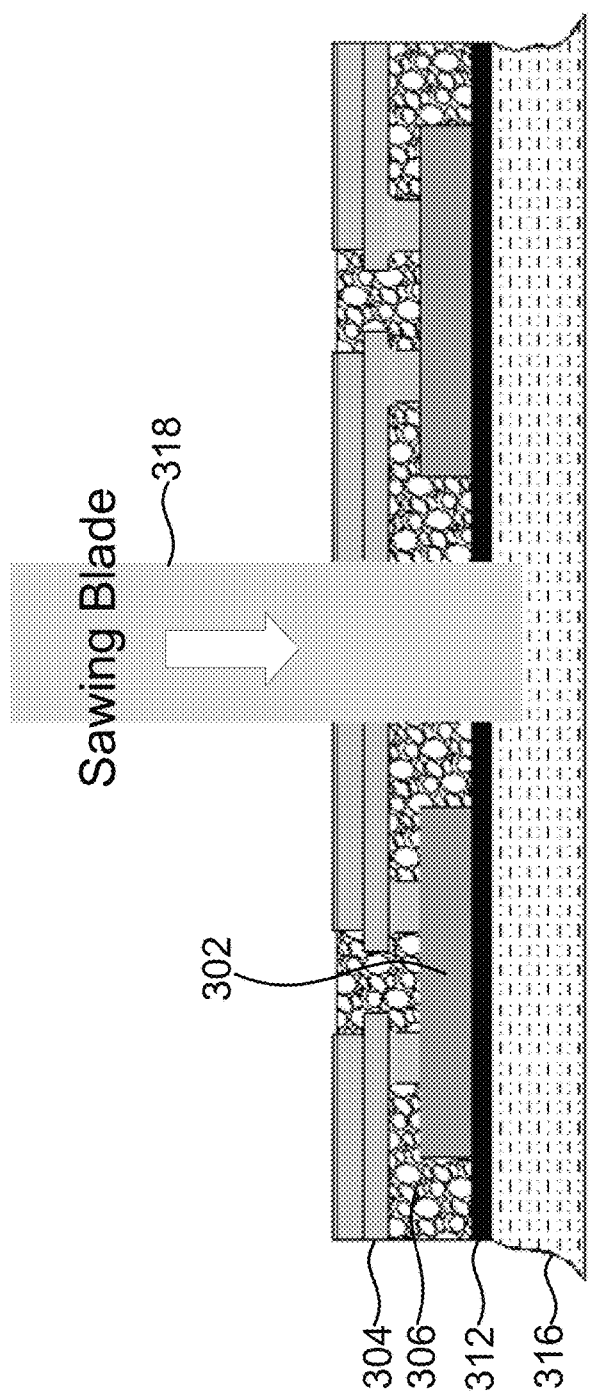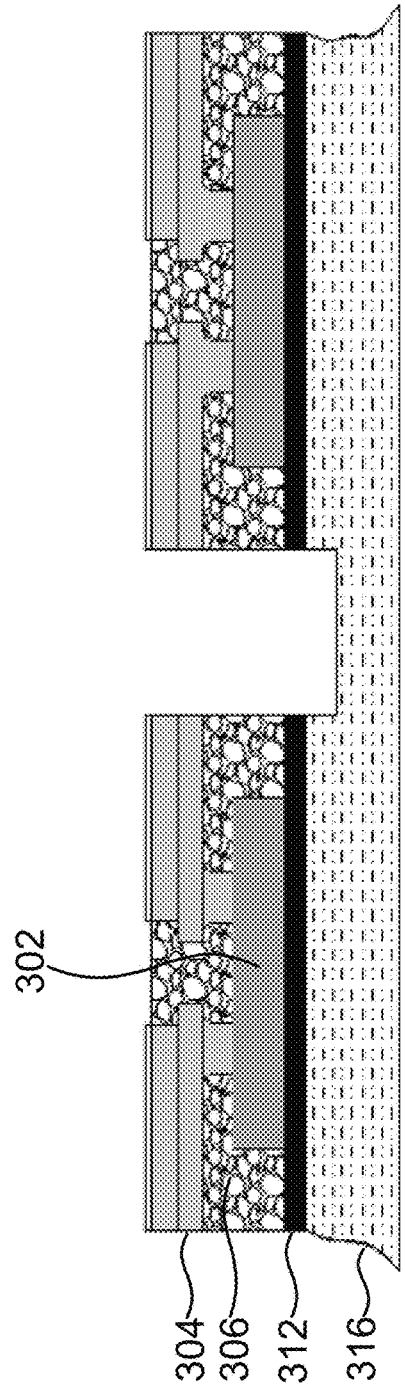

| Dimension Table (Unit: mm) | | | | | | |
|---|---|---|---|---|---|---|
| | ETDFN/ETQFN | | | ESETDFN/ESETQFN | | |
| Symbol | Max. | Nom. | Min. | Max. | Nom. | Min. |
| A | 1.20 | - | 0.10 | 1.05 | - | 0.10 |
| A1 | 0.15 | - | 0.00 | 0.15 | - | 0.00 |
| A2 | 0.400 | - | - | 0.400 | - | - |
| A3 | 0.150 | - | 0.005 | N/A | N/A | N/A |
| G | 0.150 | - | 0.005 | 0.150 | | 0.005 |
| T | 0.350 | - | 0.025 | 0.350 | | 0.025 |

EXTREMELY THIN PACKAGE

CROSS REFERENCE TO OTHER APPLICATIONS

This application is a continuation of co-pending U.S. patent application Ser. No. 14/032,696, entitled EXTREMELY THIN PACKAGE filed Sep. 20, 2013 which is incorporated herein by reference for all purposes, which claims priority to U.S. Provisional Patent Application No. 61/703,708 entitled EXTREMELY THIN PACKAGE filed Sep. 20, 2012 which is incorporated herein by reference for all purposes.

BACKGROUND OF THE INVENTION

Typical chip manufacturing assembly processes include applying EMC (Epoxy Molding Compound) to cover the entire area of a device, submitting the device for plating on lead, and then separating the device via a sawing blade. EMC fillers protect an integrated circuit from light emission induced leakage and moisture penetration but also contribute to overall package thickness. FIG. 1 illustrates a typical device structure resulting from the aforementioned assembly process. As depicted, the EMC surrounding the integrated circuit (i.e., chip) significantly contributes to the resulting device dimensions.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

Various techniques for achieving thinner package thicknesses are disclosed herein. As further described, the disclosed assembly process includes a grinding process for reducing the total device thickness. The grinding process facilitates a plurality of types of thinner package structures. In some embodiments, the grinding process is employed to leave the backside of an integrated circuit (i.e., chip) exposed, which may be acceptable for a non-sensitive light emission device. Alternatively, adhesion tape may be applied on a ground surface, for example, to protect an integrated circuit from light emission induced leakage and moisture penetration.

Figure 1:
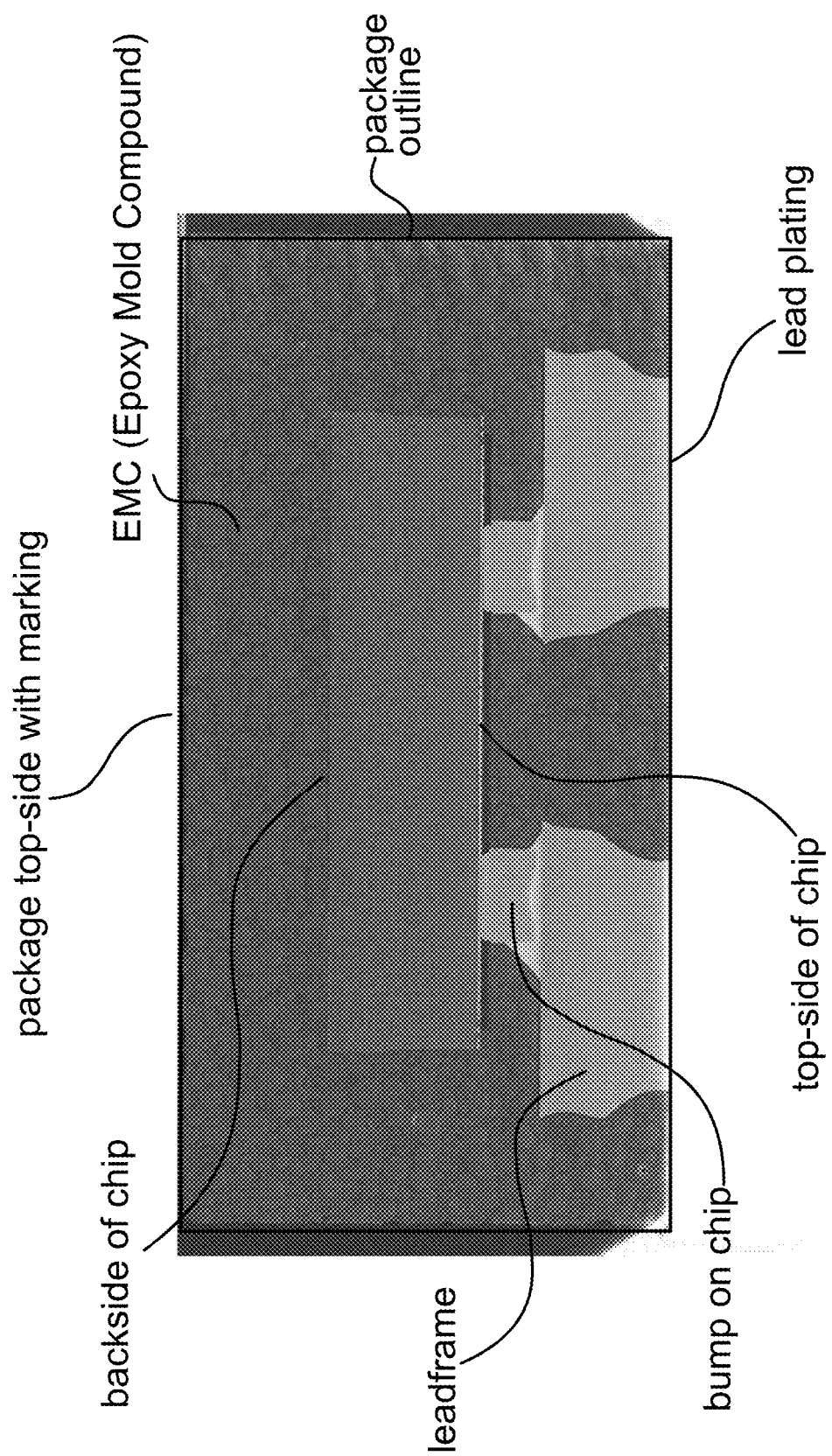
FIG. 1 illustrates a prior art device structure resulting from a typical assembly process.
Figure 2A:
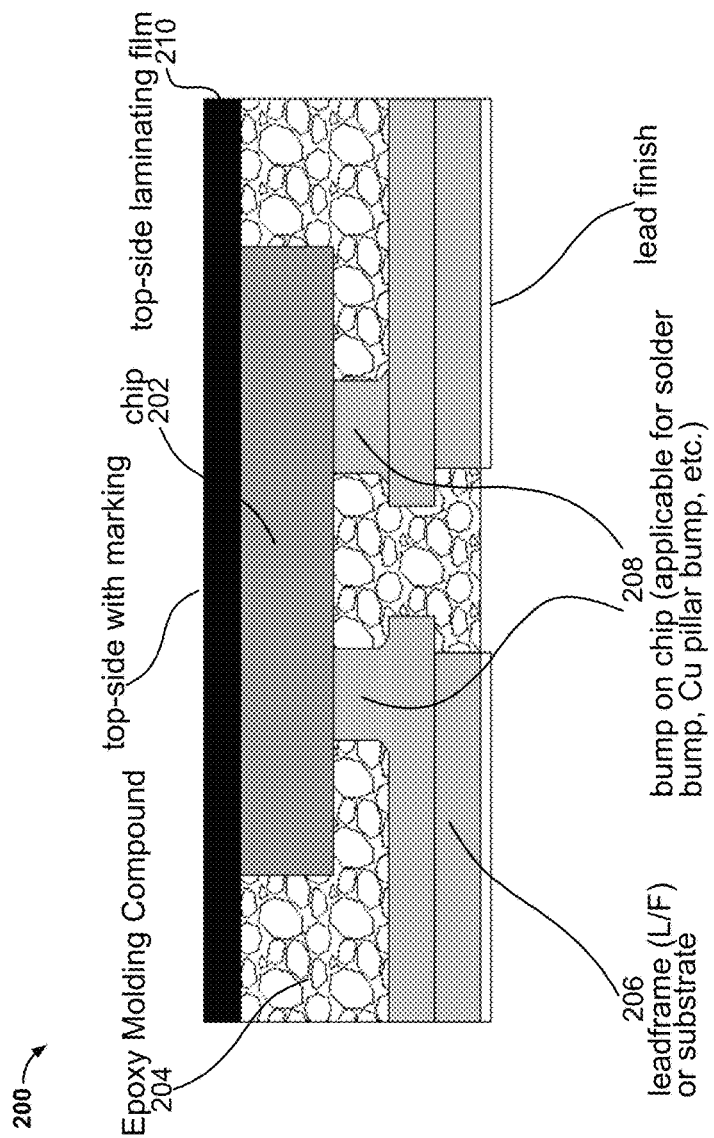
FIG. 2A illustrates an embodiment of a package structure resulting from an assembly process that includes a grinding process.

FIG. 2A illustrates an embodiment of a package structure resulting from an assembly process that includes a grinding process. As depicted, package structure 200 includes an integrated circuit (i.e., chip) 202 in part surrounded by EMC (Epoxy Molding Compound) 204 and connected to leadframe (L/F) or substrate 206 via bumps 208. In some embodiments, package structure 200 results from submitting the entire leadframe or substrate for top-side grinding after EMC injection until at least the backside of the chip is exposed and/or the desired thickness is achieved. In the given example, package structure 200 includes adhesion tape (i.e., laminating film) 210 applied on top of the device (i.e., the backside of flipped chip 202) to protect the chip. Package structure 200 may comprise, for example, an extremely thin DFN (dual flat no-lead) or QFN (quad flat no-lead) package.

Figure 2B:
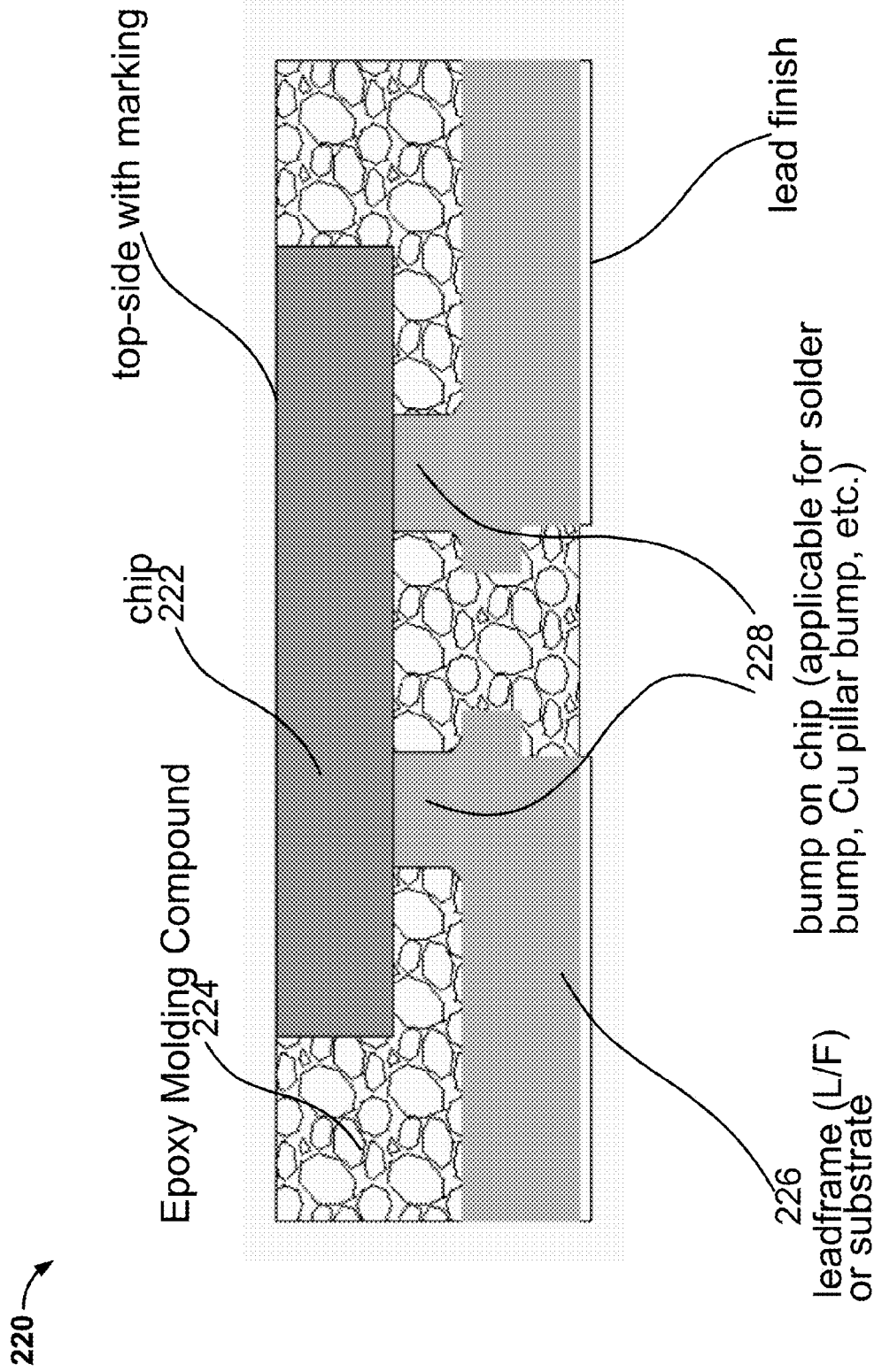
FIG. 2B illustrates an embodiment of a package structure resulting from an assembly process that includes a grinding process.

FIG. 2B illustrates an embodiment of a package structure resulting from an assembly process that includes a grinding process. As depicted, package structure 220 includes an integrated circuit (i.e., chip) 222 in part surrounded by EMC 224 and connected to leadframe or substrate 226 via bumps 228. In some embodiments, package structure 220 results from submitting the entire leadframe or substrate for top-side grinding after EMC injection until at least the backside of the chip is exposed and/or the desired thickness is achieved. In this example, the backside of integrated circuit 222 is left exposed, i.e., no adhesion tape is applied as in the embodiment of FIG. 2A. Package structure 220 may comprise, for example, an exposed silicon extremely thin DFN or QFN package.

Figure 3A:
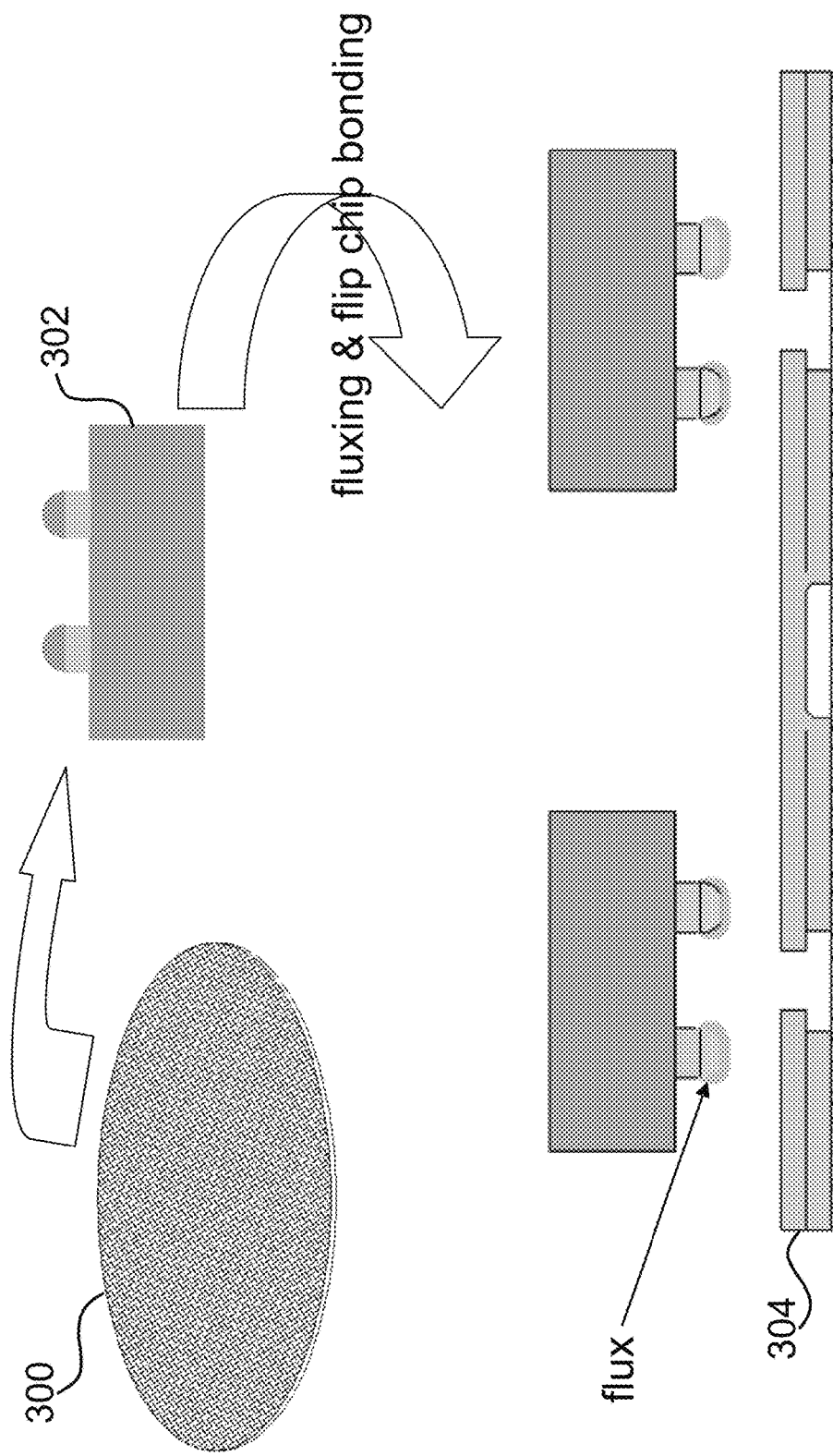
FIGS. 3A-3Q illustrate an embodiment of an assembly process for generating extremely thin package structures.
Figure 3D:
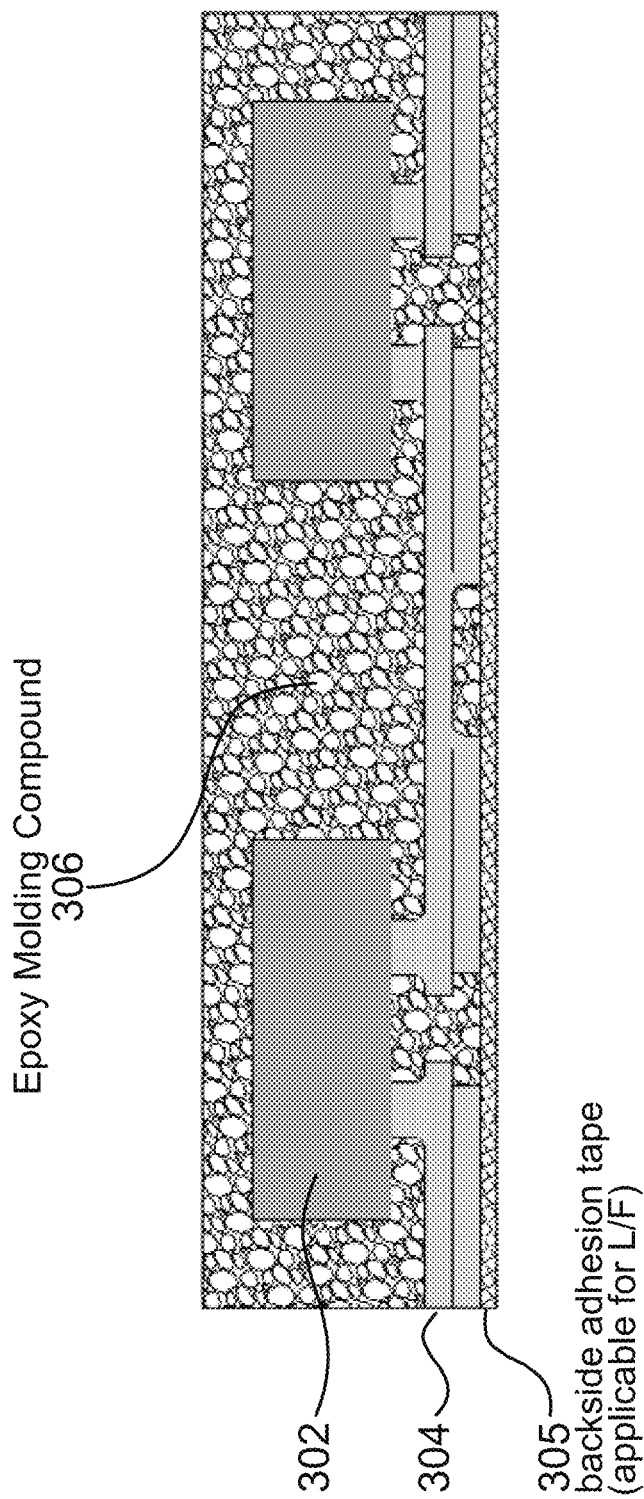
FIG. 3R illustrates example dimensions of devices resulting from the disclosed assembly process.
Figure 3G:
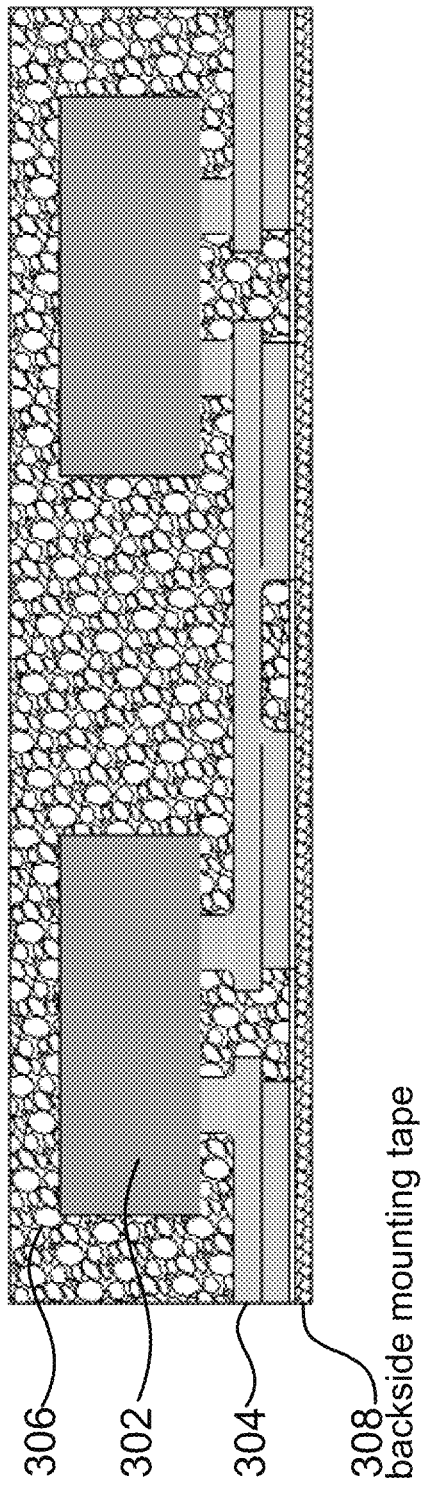
Figure 3H:
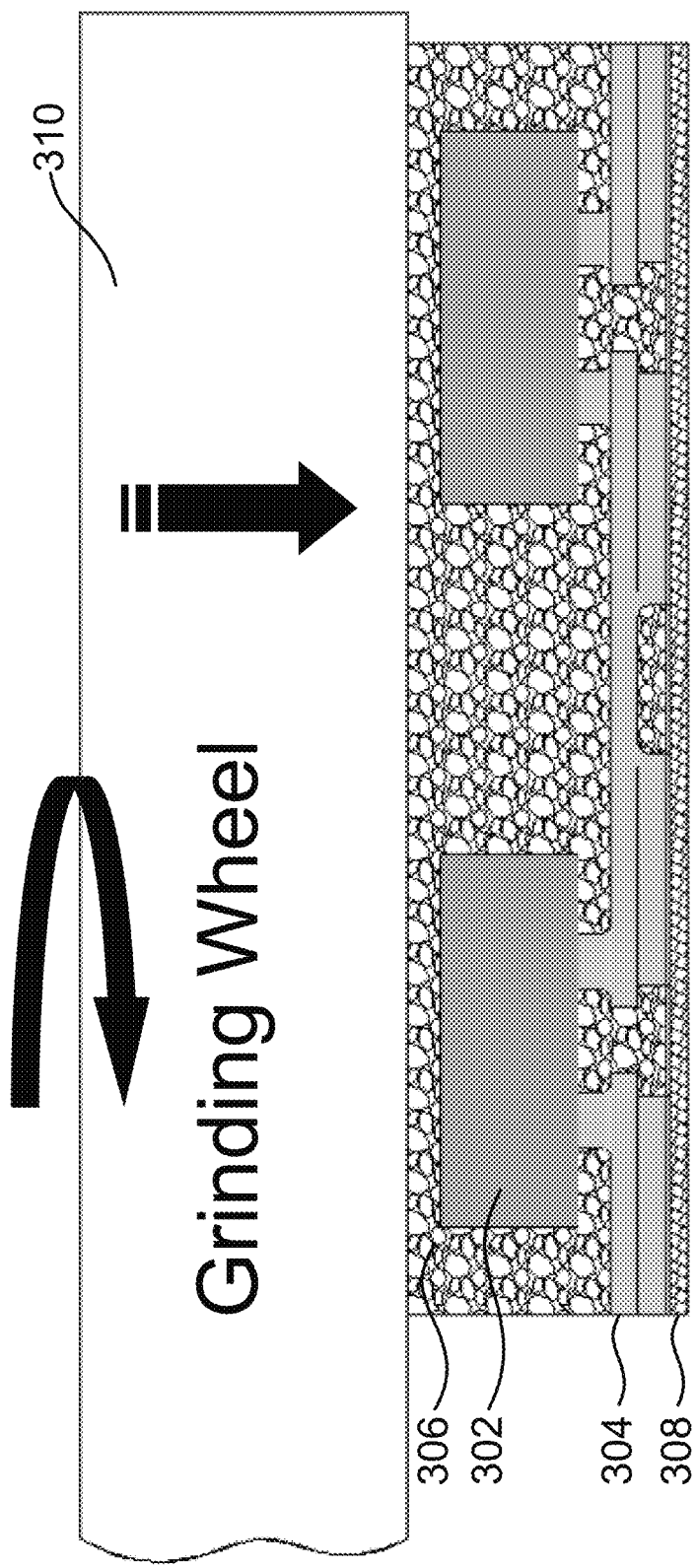
Figure 3I:
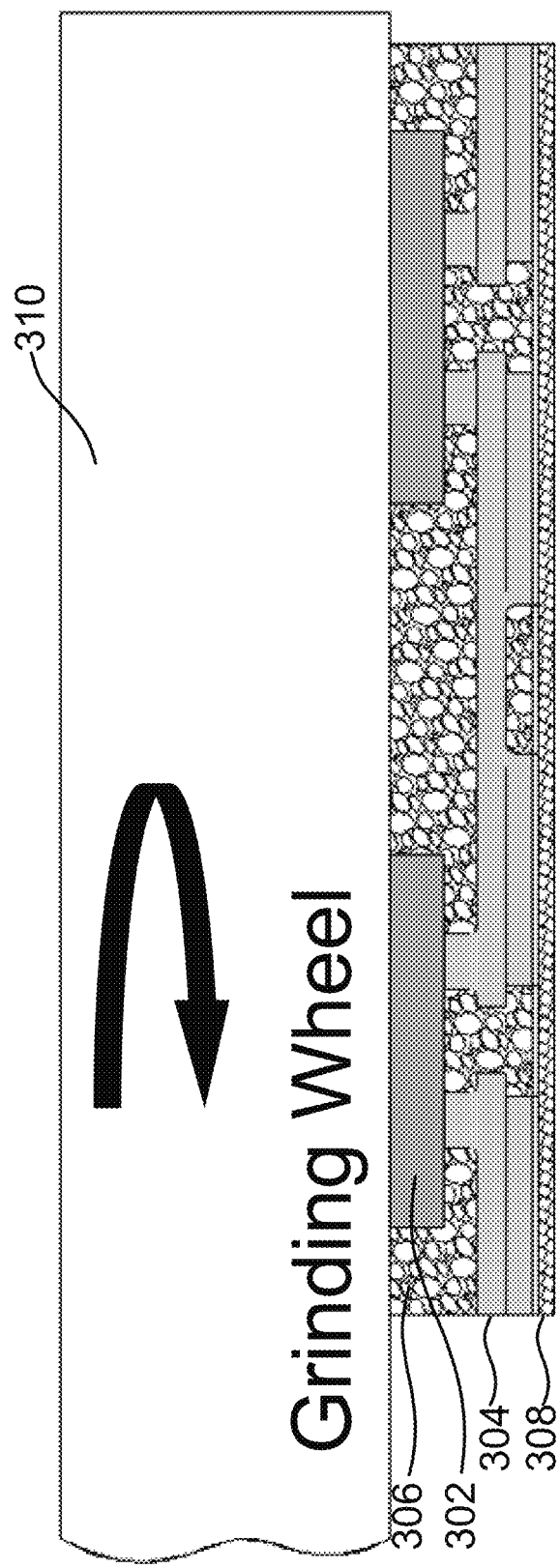
Figure 3J:
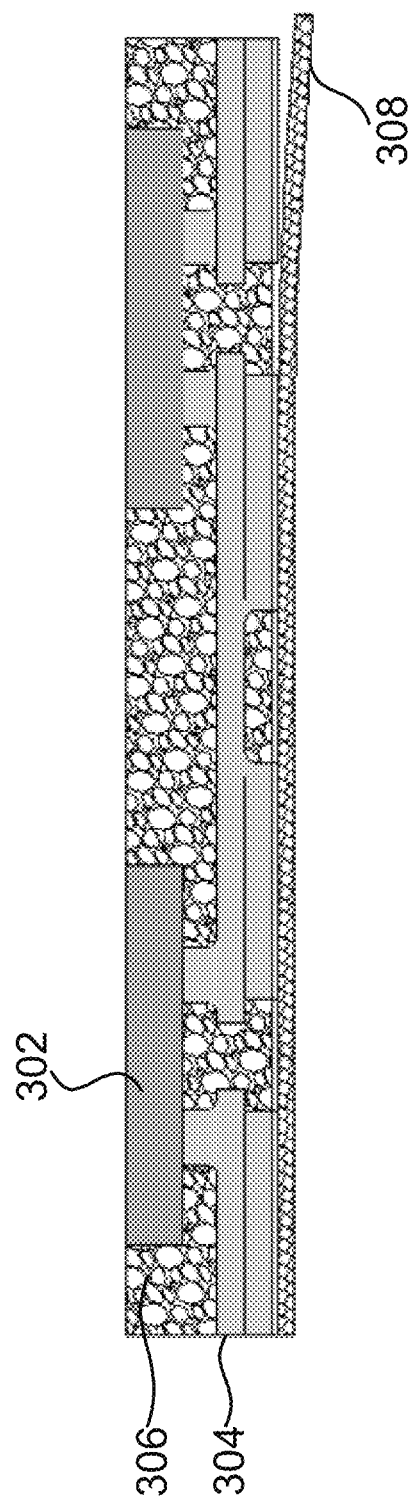
Figure 3M:
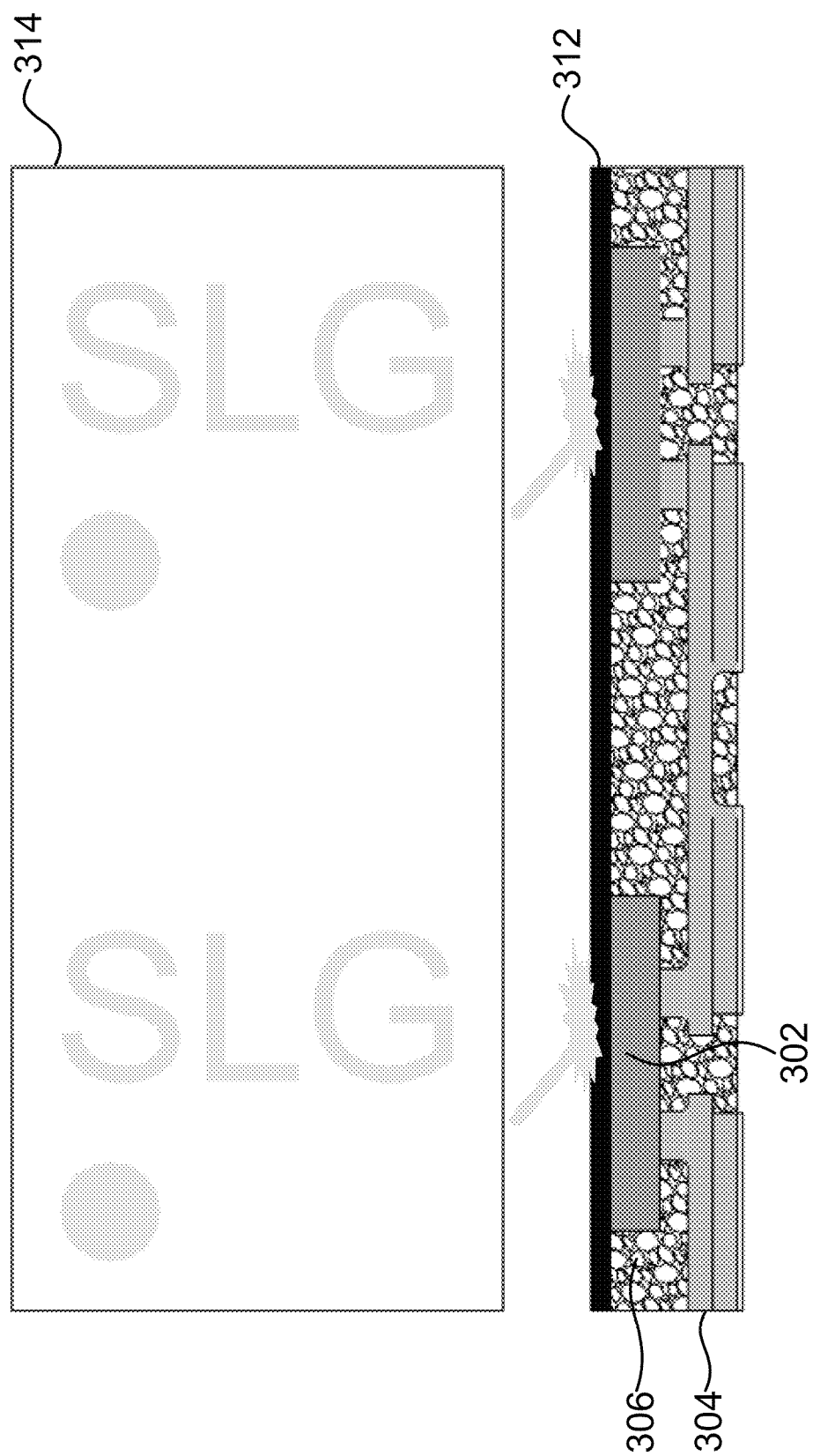
Figure 3N:
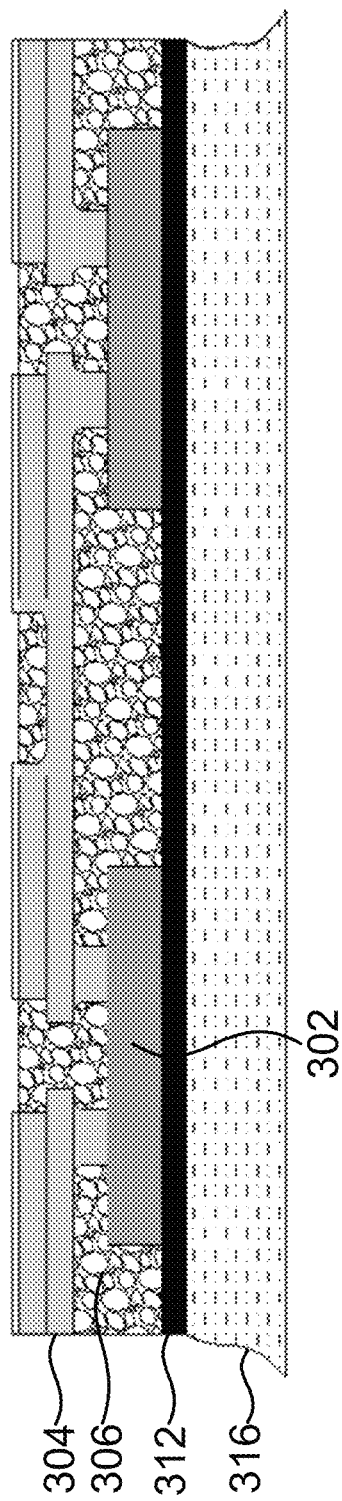
Figure 3Q:
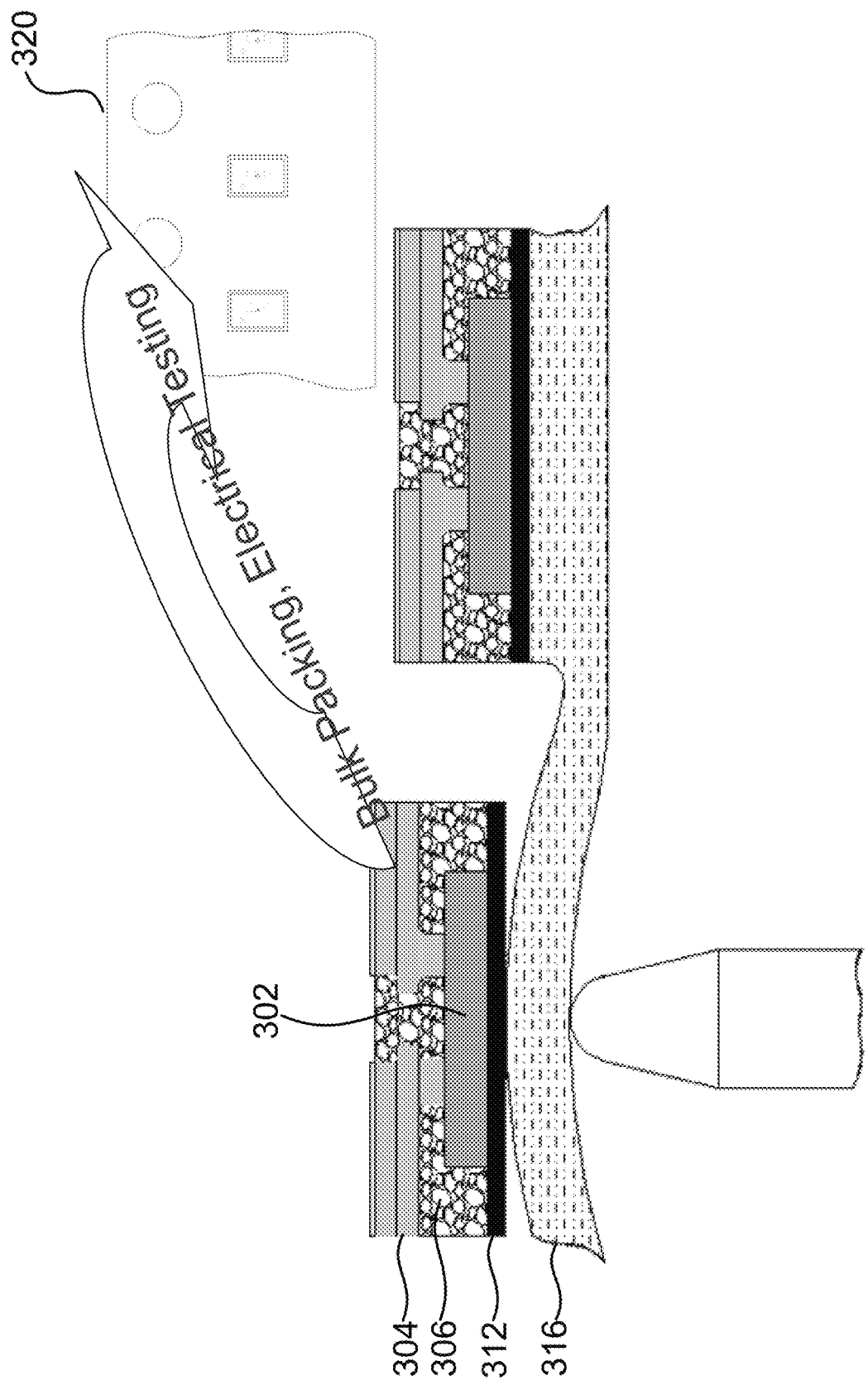

FIGS. 3A-3Q illustrate an embodiment of an assembly process for generating extremely thin package structures such as those described with respect to FIGS. 2A-2B. FIG. 3A illustrates dicing a wafer 300 to separate each chip 302 in wafer 300. As further depicted in FIG. 3A, each chip 302 subsequently undergoes flipping, flux dipping, and mounting onto a leadframe or substrate 304. FIG. 3B illustrates flip chip mounting onto the leadframe or substrate 304. FIG. 3C illustrates a reflow step to connect the bumps between chip 302 and leadframe or substrate 304. The reflow temperature profile depends on bump composition and character. FIG. 3D illustrates a molding step, which is performed, for example, by an injection mold tool. As depicted, chip 302 is surrounded by EMC 306 during this step.

FIGS. 3A-3D also illustrate backside adhesion tape 305, which is applicable for the embodiments in which chip 302 is mounted to leadframe 304. FIG. 3E illustrates a step for removing backside adhesion tape 305. FIG. 3F illustrates a lead plating step for providing a lead finish 307 in the embodiments in which chip 302 is mounted to leadframe 304. In embodiments in which chip 302 is mounted to substrate 304, the substrate's terminals/leads already have a pre-plated finish. FIG. 3G illustrates a leadframe/substrate mounting (i.e., backside laminating) step. As depicted, backside mounting tape 308 is applied in preparation for subsequent top-side grinding.

FIG. 3H illustrates a grinding step via which top-side grinding is performed using grinding wheel 310. This top-side grinding process is specially introduced into the assembly process to achieve a desired package thickness and is not used in other existing DFN/QFN processes. FIG. 3I illustrates continued top-side grinding until desired chip and/or total device thicknesses are achieved. In some embodiments, the grinding is stopped once the backside of chip 302 is exposed. Alternative, as depicted in FIG. 3I, the grinding is stopped once a desired chip thickness is achieved. Once the grinding is complete, the ground surface is polished, for example, to release the shear stress introduced during grinding and/or increase the adhesion between the ground surface and a top adhesion film (which is used for extremely thin DFN/QFN packages such as package structure 200 depicted in FIG. 2A).

FIG. 3J illustrates a de-taping step in which backside mounting tape 308 is removed. FIG. 3K illustrates a laminating step in which a top-side adhesion film 312 is placed to protect the device from light emission induced leakage (for devices that are sensitive to light emission) and moisture penetration. FIG. 3L illustrates a laminate cure 313 step in which top-side adhesion film 312 is treated to ensure adherence to the underlying EMC and chip backside. FIG. 3M illustrates a marking step in which the top-side is marked for device identification and traceability purposes and illustrates a top view 314 after marking.

FIG. 3N illustrates a mounting step in which leadframe/substrate 304 is flipped around and mounting tape 316 is applied for holding the device in place during a subsequent package sawing step. The sawing process is performed on leadframe/substrate 304. FIG. 3O illustrates a sawing step in which each device is separated via sawing blade 318. FIG. 3P illustrates the completion of a package saw singulation step. FIG. 3Q illustrates a step in which mounting tape 316 is manually scrubbed and/or a pick-and-place handler is employed to remove the devices from tape 316 for bulk packing, (electrical) testing, and/or taping/packing 320.

Although a particular order of steps is illustrated in the assembly process depicted in FIGS. 3A-3Q, the order of the steps may be altered in other embodiments. For example, the grinding process of FIGS. 3H-3I may be performed at any appropriate stage of the assembly process. Furthermore, inclusion of top-side adhesion film 312 is optional. That is, top-side adhesion film 312 is not included in exposed silicon package structures such as package structure 220 depicted in FIG. 2B.

Figure 3R:
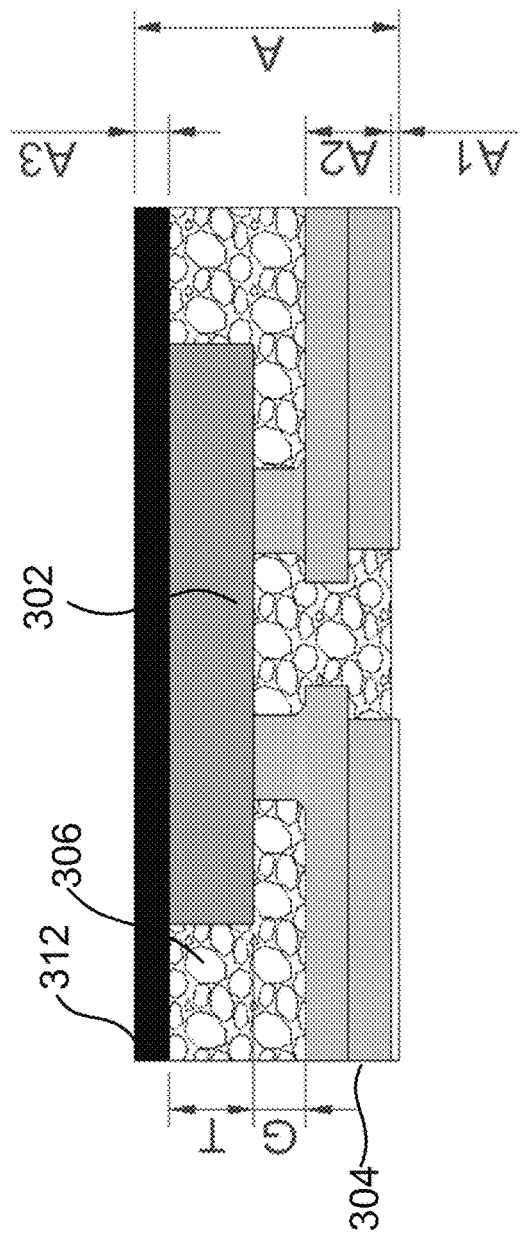

FIG. 3R illustrates example dimensions of devices resulting from the assembly process of FIGS. 3A-3Q. The given table provides example dimensions for extremely thin DFN (ETDFN) and extremely thin QFN (ETQFN) as well as exposed silicon extremely thin DFN (ESETDFN) and exposed silicon extremely thin QFN (ESETQFN) packages. Overall, thinner packages are achievable due to the included grinding process.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device, comprising:
   an integrated circuit connected to a leadframe or substrate via connections; and
   EMC (Epoxy Molding Compound) surrounding the integrated circuit except at a backside of the integrated circuit and connecting areas via which the integrated circuit is connected to the leadframe or substrate;
   wherein the backside of the integrated circuit is left exposed and wherein during device assembly grinding is used to remove EMC from the device.

2. The device of claim 1, wherein during device assembly EMC between the backside of the integrated circuit and top-side of the device is removed.

3. The device of claim 1, wherein the exposed backside of the integrated circuit is polished.

4. The device of claim 1, wherein grinding comprises grinding until the backside of the integrated circuit is exposed.

5. The device of claim 1, wherein grinding comprises grinding until a desired package thickness is achieved.

6. The device of claim 1, wherein grinding comprises grinding until a desired integrated circuit thickness is achieved.

7. The device of claim 1, wherein grinding comprises grinding at least a portion of the backside of the integrated circuit.

8. The device of claim 1, wherein the backside of the integrated circuit comprises exposed silicon.

9. A device, comprising:
   an integrated circuit connected to a leadframe or substrate via connections; and
   EMC (Epoxy Molding Compound) surrounding the integrated circuit except at a backside of the integrated circuit and connecting areas via which the integrated circuit is connected to the leadframe or substrate;
   wherein the backside of the integrated circuit is left exposed and wherein the device comprises an extremely thin DFN (dual flat no-lead) or QFN (quad flat no-lead) package.

10. The device of claim 1, wherein the device comprises an exposed silicon extremely thin DFN (dual flat no-lead) or QFN (quad flat no-lead) package.

11. A method, comprising:
    molding a device comprising an integrated circuit connected to a leadframe or substrate with EMC (Epoxy Molding Compound);
    grinding EMC to expose the integrated circuit backside; and
    applying an adhesion film to a top-side of the device to protect the backside of the integrated circuit that is exposed.

12. The method of claim 11, wherein grinding comprises removing EMC between the backside of the integrated circuit and top-side of the device.

13. The method of claim 11, wherein grinding comprises grinding the device top-side until the integrated circuit backside is exposed.

14. The method of claim 11, wherein grinding comprises grinding until the backside of the integrated circuit is exposed.

15. The method of claim 11, wherein grinding comprises grinding until a desired package thickness is achieved.

16. The method of claim 11, wherein grinding comprises grinding until a desired integrated circuit thickness is achieved.

17. The method of claim 11, wherein grinding comprises grinding at least a portion of the backside of the integrated circuit.

18. The method of claim 11, wherein the backside of the integrated circuit comprises exposed silicon.

19. The method of claim 11, wherein the device comprises an extremely thin DFN (dual flat no-lead) or QFN (quad flat no-lead) package.

20. A device, comprising:
    an integrated circuit connected to a leadframe or substrate via connections; and
    EMC (Epoxy Molding Compound) surrounding the integrated circuit except at a backside of the integrated circuit and connecting areas via which the integrated circuit is connected to the leadframe or substrate;
    wherein the backside of the integrated circuit is left exposed and wherein the device comprises a light emission device.

21. The device of claim 20, wherein the device comprises an extremely thin DFN (dual flat no-lead) or QFN (quad flat no-lead) package.

* * * * *

UNITED STATES PATENT AND TRADEMARK OFFICE
CERTIFICATE OF CORRECTION

PATENT NO. : 9,735,018 B2
APPLICATION NO. : 14/834333
DATED : August 15, 2017
INVENTOR(S) : Chen et al.

Page 1 of 2

It is certified that error appears in the above-identified patent and that said Letters Patent is hereby corrected as shown below:

On the Title Page

Below Abstract, Please insert -- 45 Claims, 17 Drawing Sheets --

In the Claims

Insert:
-- 22. The device of claim 20, wherein during device assembly EMC between the backside of the integrated circuit and top-side of the device is removed.
23. The device of claim 20, wherein the exposed backside of the integrated circuit is polished.
24. The device of claim 20, wherein the backside of the integrated circuit comprises exposed silicon.
25. The device of claim 20, wherein during device assembly grinding is used to remove EMC from the device.
26. The device of claim 25, wherein grinding comprises grinding the device top-side until the integrated circuit backside is exposed.
27. The device of claim 25, wherein grinding comprises grinding until the backside of the integrated circuit is exposed.
28. The device of claim 25, wherein grinding comprises grinding until a desired package thickness is achieved.
29. The device of claim 25, wherein grinding comprises grinding until a desired integrated circuit thickness is achieved.
30. The device of claim 25, wherein grinding comprises grinding at least a portion of the backside of the integrated circuit.
31. A method, comprising:
connecting an integrated circuit to a leadframe or substrate via connections; and
surrounding the integrated circuit with EMC (Epoxy Molding Compound) except at a backside of the integrated circuit and connecting areas via which the integrated circuit is connected to the leadframe or substrate;
wherein the backside of the integrated circuit is left exposed and wherein the integrated circuit comprises a light emission device.

Signed and Sealed this
Twenty-fifth Day of December, 2018

Andrei Iancu
*Director of the United States Patent and Trademark Office*

32. The method of claim 31, wherein surrounding the integrated circuit with EMC except at a backside of the integrated circuit and connecting areas via which the integrated circuit is connected to the leadframe or substrate comprises removing EMC adjacent to the backside of the integrated circuit.
33. The method of claim 31, further comprising polishing the exposed backside of the integrated circuit.
34. The method of claim 31, wherein surrounding the integrated circuit with EMC except at a backside of the integrated circuit and connecting areas via which the integrated circuit is connected to the leadframe or substrate comprises grinding EMC to expose the backside of the integrated circuit.
35. The method of claim 34, wherein grinding comprises grinding until a desired package thickness is achieved.
36. The method of claim 34, wherein grinding comprises grinding until a desired integrated circuit thickness is achieved.
37. The method of claim 34, wherein grinding comprises grinding at least a portion of the backside of the integrated circuit.
38. The method of claim 31, wherein the backside of the integrated circuit comprises exposed silicon.
39. The method of claim 31, wherein the integrated circuit is packaged in an extremely thin DFN (dual flat no-lead) or QFN (quad flat no-lead) package.
40. The device of claim 9, wherein during device assembly EMC between the backside of the integrated circuit and top-side of the device is removed.
41. The device of claim 9, wherein the exposed backside of the integrated circuit is polished.
42. The device of claim 9, wherein grinding is used to remove EMC until a desired package thickness is achieved.
43. The device of claim 9, wherein grinding is used to remove EMC until a desired integrated circuit thickness is achieved.
44. The device of claim 9, wherein grinding is used to remove EMC and at least a portion of the backside of the integrated circuit.
45. The device of claim 9, wherein the backside of the integrated circuit comprises exposed silicon. --